(12) United States Patent
Huang et al.

(10) Patent No.: US 8,241,480 B2
(45) Date of Patent: Aug. 14, 2012

(54) HOUSING FOR ELECTRONIC DEVICE AND METHOD OF MAKING THE HOUSING

(75) Inventors: Gang Huang, Shenzhen (CN); Yan-Min Wang, Shenzhen (CN); Qiang Wang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 475 days.

(21) Appl. No.: 12/563,246

(22) Filed: Sep. 21, 2009

(65) Prior Publication Data

US 2010/0108344 A1    May 6, 2010

(30) Foreign Application Priority Data

Oct. 30, 2008   (CN) .......................... 2008 1 0305280

(51) Int. Cl.
*C25D 5/02*   (2006.01)
*B01D 57/02*  (2006.01)

(52) U.S. Cl. ..................... 205/122; 205/170; 204/471

(58) Field of Classification Search .................. 205/118, 205/122, 170; 204/471
See application file for complete search history.

(56) References Cited

U.S. PATENT DOCUMENTS 7,883,838 B2 *   2/2011   Kim et al. ..................... 430/322

FOREIGN PATENT DOCUMENTS

JP              62109999 A   *   5/1987

* cited by examiner

*Primary Examiner* — Luan Van
(74) *Attorney, Agent, or Firm* — Altis Law Group, Inc.

(57) ABSTRACT

A method of making a housing, comprising the steps of: providing a transparent plastic substrate, the substrate having an outer surface and an inner surface; coating at least portions of the outer surface with a photosensitizer; activating the substrate by using an energy ray to irradiate areas of the outer surface covered with the photosensitizer to form a conductive medium layer thereon; electroplating the activated substrate, an electroplated coating formed on the irradiated area in a predetermined pattern; forming an electrophoretic coating on the surface of the electroplated coating by an electrophoresis process; and forming a paint coating on the inner surface of the substrate. A housing made by the present method is provided.

5 Claims, 1 Drawing Sheet

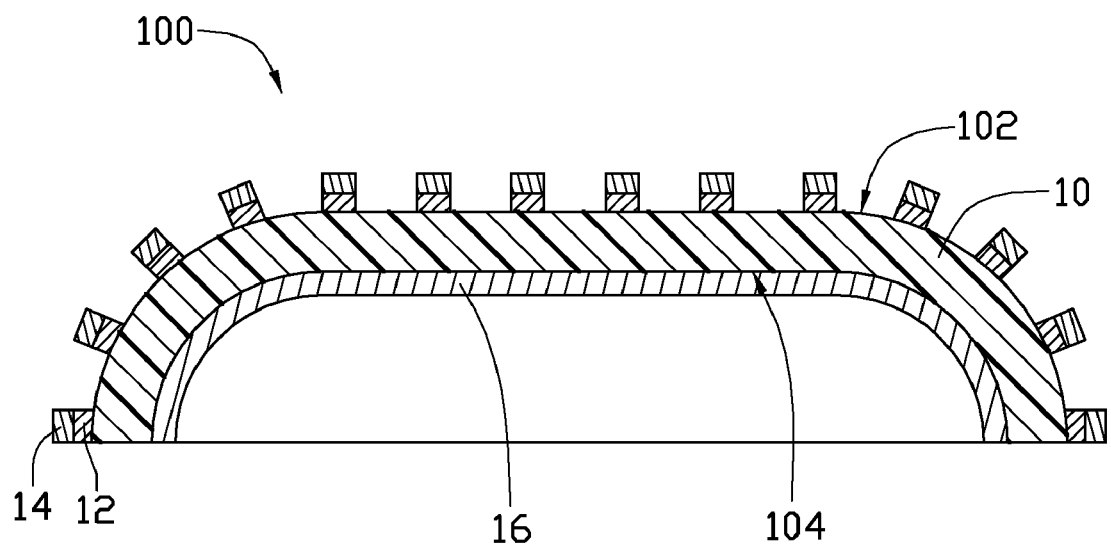

HOUSING FOR ELECTRONIC DEVICE AND METHOD OF MAKING THE HOUSING

BACKGROUND

1. Technical Field

The present disclosure relates to housings for electronic devices, particularly to a housing having a decorative pattern and a method of making the housing.

2. Description of Related Art

Molded plastic housings for electronic devices are usually processed by surface treatment to acquire decorative surfaces. In-Mold Labeling (IML) process is a typical method to produce such decorative plastic articles. The process is carried out by molding a plastic substrate to combination with a plastic film in a mold. Prior to the substrate being molded, a pattern is printed on the film. The molded substrate is then combined with the patterned film. The pattern may not be abraded or eroded because it is located between the film and the substrate. However, during the process of molding the substrate, the film is prone to melt because of the high temperature of the molten plastic injected into the mold. If the film melts, it is likely that the pattern printed on the film will become distorted. Moreover, it is difficult to achieve a three-dimensional decorative pattern only by printing.

Therefore, there is room for improvement within the art.

BRIEF DESCRIPTION OF THE DRAWING

Many aspects of the housing for electronic device can be better understood with reference to the following drawing. The components in the drawing are not necessarily to scale, the emphasis instead being placed upon clearly illustrating the principles of the present housing.

The FIGURE is a cross-section view of an exemplary embodiment of the present housing.

DETAILED DESCRIPTION OF THE EXEMPLARY EMBODIMENT

Referring to the FIGURE, an exemplary housing 100 is used for electronic devices such as, mobile phones, laptop computers, cameras, or game consoles. The housing 100 includes a substrate 10, an electroplated coating 12, an electrophoretic coating 14 and a paint coating 16.

The substrate 10 can be made of transparent plastic. The substrate 10 has an outer surface 102 and an inner surface 104 opposite to the outer surface 102.

The electroplated coating 12 is electroplated on the outer surface 102. The outer surface 102 is partially covered by the electroplated coating 12 to form a predetermined pattern. The electrophoretic coating 14 with a first color is further formed on the surface of the electroplated coating 12. The paint coating 16 is painted on the inner surface 104 of the substrate 10. The paint coating 16 has a second color which differs from the first color.

An exemplary method of making the housing 10 may include at least the following steps.

Provide a substrate 10. The substrate 10 can be molded by a transparent plastic material.

Coat a photosensitizer at least on portions of the outer surface 102 of the substrate 10. The photosensitizer contains at least one organic metallic compound and at least one energy ray activatable component. When the surface coated by the photosensitizer is irradiated by an energy ray such as a laser, a conductive medium layer for electricity conduction can be formed on the surface. The conductive medium layer can be a metallic layer or a layer of metallic grain of crystallization.

Activate the portions of the outer surface 102 covered by the photosensitizer using an energy ray such as a laser. The energy ray irradiates predesigned areas of the outer surface 102 to form a conductive medium layer for electrical conduction.

Electroplate the activated substrate 10 to form an electroplated patterned coating 12 on the irradiated area.

Process the electroplated substrate 10 by an electrophoresis process. In the electrophoresis process, the substrate 10 is connected to an electrode (e.g., the cathode). The counter electrode (e.g., the anode) and the substrate 10 may be immersed into a solution containing water-soluble paint components such as resins and dyes. While being electrically connected, the paint components are deposited onto the surface of the electroplated coating 12 to form an electrophoretic coating 14 with the first color.

Paint the paint coating 16 with the second color on the inner surface 104 of the substrate 10.

It should be understood that the method of making the housing 100 can further include forming a transparent protective paint coating as the outmost coating on the whole outer surface 102. The housing 100 can further include a transparent protective paint coating as the outmost coating on the whole outer surface 102.

It should be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of making a housing, comprising the steps of:
   providing a transparent plastic substrate, the substrate having an outer surface and an inner surface;
   coating at least portions of the outer surface with a photosensitizer;
   activating the substrate by using an energy ray to irradiate areas of the outer surface covered with the photosensitizer to form a conductive medium layer thereon;
   electroplating the activated substrate, an electroplated coating formed on the irradiated area in a predetermined pattern;
   forming an electrophoretic coating on the surface of the electroplated coating by an electrophoresis process; and
   forming a paint coating on the inner surface of the substrate.

2. The method of making a housing as claimed in claim 1, wherein the photosensitizer contains at least one organic metallic compound and at least an energy ray activatable component.

3. The method of making a housing as claimed in claim 1, wherein the conductive medium layer is a metallic layer or a layer of metallic grain of crystallization.

4. The method of making a housing as claimed in claim 1, wherein the active energy ray is a laser.

5. The method of making a housing as claimed in claim 1, wherein the electrophoretic coating and the paint coating have different colors.

* * * * *